United States Patent [19]
Campbell et al.

[11] 3,986,049
[45] Oct. 12, 1976

[54] AUDIO COMPRESSOR/LIMITER AMPLIFIER

[75] Inventors: Whitney Robertson Campbell, Elk Grove Village; Raymond Maurice Fardoux, Wilmette, both of Ill.

[73] Assignee: Motorola, Inc., Schaumburg, Ill.

[22] Filed: June 30, 1975

[21] Appl. No.: 591,388

[52] U.S. Cl. .............................. 307/237; 307/264; 328/171; 328/175; 330/29; 330/141; 330/145; 333/14
[51] Int. Cl.² .................... H03K 5/08; H03K 1/14
[58] Field of Search .................. 307/230, 237, 264; 328/168, 169, 171–173, 175; 330/29, 110, 141, 145; 333/14

[56] References Cited
UNITED STATES PATENTS

| | | | |
|---|---|---|---|
| 3,021,489 | 2/1962 | Nielsen | 330/141 X |
| 3,576,451 | 4/1971 | Markow | 307/237 X |
| 3,790,896 | 2/1974 | Shimizu et al. | 330/29 |

*Primary Examiner*—John Zazworsky
*Attorney, Agent, or Firm*—James W. Gillman; Eugene A. Parsons; Sang Ki Lee

[57] ABSTRACT

An audio compressor amplifier including an operational amplifier with compressor means connected from the output to the input for compressing signals at the output to a predetermined constant level in a predetermined attack time and including a plurality of diodes connected to reduce the series resistance in the compressor means for decreasing the attack time when the output signal exceeds the predetermined constant level by a predetermined amount, and a gain control feedback resistor connected from the output to the input of the operational amplifier and including a second resistor and a plurality of diodes connected in parallel therewith to reduce the gain of the operational amplifier and provide peak limiting action when a signal at the output exceeds a predetermined value in excess of the predetermined constant level.

8 Claims, 3 Drawing Figures

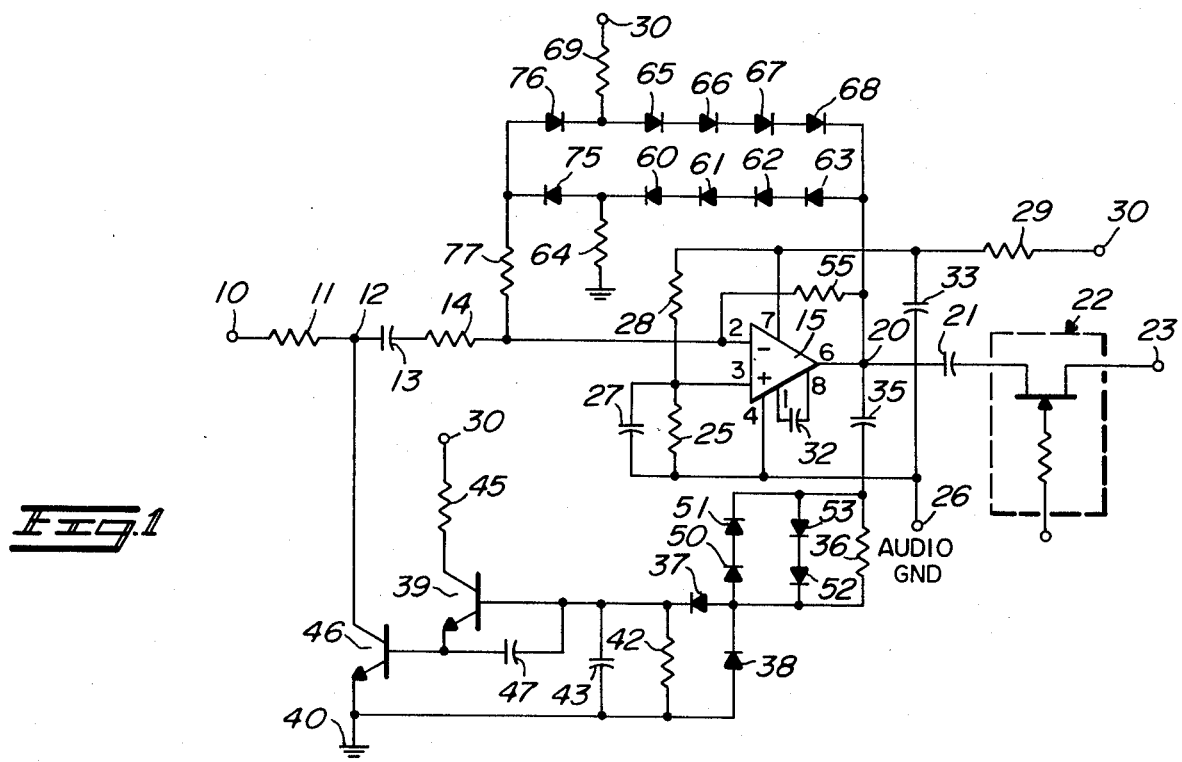

AUDIO COMPRESSOR/LIMITER AMPLIFIER

BACKGROUND OF THE INVENTION

1. Field of the Invention

Audio compressor amplifiers are utilized to amplify voice and/or tones to provide an output having a predetermined constant level. Radio and television broadcasting stations use audio compression and peak limiting to avoid over-modulation. Audio compressor amplifier circuits are especially useful in apparatus utilized with phone lines and two-way radio stations and may, for example, be used to provide a predetermined constant level for transmission over a phone line or for reception from a phone line.

2. Description of the Prior Art

Prior art audio compressor amplifiers generally include an operational amplifier having a constant gain and circuitry connected between the output and the input for reducing the signal applied to the input when the output exceeds the predetermined constant level desired. When an extremely large signal is applied to these prior art audio compressor amplifiers the circuit has a tendency to overshoot and reduce the output signal to near zero. A short period of time is then required for the amplifier to stabilize and return the output signal to the predetermined constant level. Because the period of time when the input signal is excessively large and when the output signal is zero from overshooting is relatively long, relatively severe distortion and loss of audio information occurs.

SUMMARY OF THE INVENTION

The present invention pertains to an audio compressor/limiter amplifier including an audio amplifier circuit having compressor means connected from the output to the input thereof for controlling the input to compress signals at the output to a predetermined constant level in a predetermined attack time and semiconductor means connected in said compressor means for decreasing the attack time when the output signal exceeds the predetermined constant level by a predetermined amount, and gain control feedback means connected between the output and input of the amplifier and including semiconductor controlled circuitry for reducing the gain of the amplifier and providing a peak limiting action when a signal at the output exceeds a predetermined value in excess of the predetermined constant level.

It is an object of the present invention to provide an audio compressor/limiter amplifier including means for reducing the gain of the amplifier and provide peak limiting action during excessively high input signals to reduce the amplitude of the output signals and distortion caused by overdriving the amplifier, and further including compressor means connected between the output and the input with a variable R-C time to reduce overshooting and the attack time.

It is a further object of the present invention to provide an audio compressor/limiter amplifier which may be utilized with field effect transistors to drive phone lines and the like and which protects the field effect transistors from excessive signals.

These and other objects of this invention will become apparent to those skilled in the art upon consideration of the accompanying specification, claims and drawings.

BRIEF DESCRIPTION OF THE DRAWINGS

Referring to the drawings:

FIG. 1 is a schematic diagram of an audio compressor/limiter amplifier including an embodiment of the present invention;

FIG. 2 is a waveform of an output signal from a prior art audio compressor amplifier; and FIG. 3 illustrates several waveforms representative of output signals from the apparatus of FIG. 1.

DESCRIPTION OF THE PREFERRED EMBODIMENT

Referring specifically to FIG. 1 the numeral 10 designates an input terminal to the audio compressor/limiter amplifier. Terminal 10 is connected through a resistor 11 to a junction 12 which is connected through a series connected capacitor 13 and resistor 14 to terminal 2 of an operational amplifier 15. Terminal 2 is the inverting input of the operational amplifier 15. The operational amplifier 15 may be any suitable amplifier commercially available on the market and, in the present embodiment the pin designations coincide with an operational amplifier number 748CN, manufactured by National Semiconductor, Inc. or operational amplifier ML748CS, manufactured by Microsystems International, Ltd. The output terminal of the operational amplifier 15 is designated 6 and is connected to a junction 20, which is connected through a capacitor 21 and field effect transistor gate, generally designated 22, to an output terminal 23. A terminal 3 of the operational amplifier 15 is a second or comparison input adapted to have a predetermined voltage applied thereto (approximately ½ of the supply voltage in the quiescent state), which sets the voltage of the input terminal 2. Terminal 2 assumes approximately the same potential as terminal 3 to maintain an input differential amplifier in balance. The terminal 3 is connected through a resistor 25 to an audio return or ground terminal 26. A bypass capacitor 27 is connected in parallel with the resistor 25. The input terminal 3 is also connected through a pair of series connected resistors 28 and 29 to a terminal 30 adapted to have a positive voltage supply (not shown) attached thereto. Terminal 1 of the operational amplifier 15 is connected through a capacitor 32 to terminal 8 thereof and terminal 4 is connected to the audio ground terminal 26. Terminal 7 of the operational amplifier 15 is connected to the junction of the resistors 28 and 29 to provide a positive source of voltage to the operational amplifier 15. A relatively large filter capacitor 33 is connected from the junction of the resistors 28 and 29 to the audio ground 26. All of these connections are relatively standard and will not be further elaborated upon in this discussion.

The audio at the output terminal 6 of the operational amplifier 15 is coupled through a capacitor 35 to one side of a resistor 36. The other side of the resistor 36 is connected to the anode of a diode 37 and the cathode of a diode 38. The cathode of the diode 37 is connected to the base of an NPN type transistor 39 and the anode of the diode 38 is connected to chassis ground 40. The diodes 37 and 38 form a rectifier for the audio signals applied thereto and a parallel connected resistor 42 and capacitor 43 connected from the base of the transistor 39 to ground 40 form a filter to supply a DC voltage to the base of the transistor 39 varying in accordance with the audio available at the output of the operational amplifier 15. The collector of the transistor 39 is connected through a resistor 45 to the positive voltage terminal 30 and the emitter is connected directly to the base of a second NPN type transistor 46. A small capacitor 47 is connected from the base of the transistor 39 to the base of the transistor 46. The emitter of the transistor 46 is connected directly to ground 40 and the collector is connected directly to the junction 12. The above described circuitry, connected between the output of the operational amplifier 15 at junction 20 and the input at junction 12, is referred to as compressor circuitry. The transistors 39 and 46 operate in response to the DC applied to the bases thereof to vary the input signal applied to the terminal 2 of operational amplifier 15, by shunting a portion of the input signal to ground, and thereby compressing the signal or maintain the output signal at a predetermined constant output level.

Capacitor 43 and resistor 42 form an R-C time constant which controls the release time of the compressor. Capacitor 43 and resistor 36 form an R-C time constant which controls the normal attack time of the compressor. The "attack time" is defined as the time after application of a signal, above the threshold of compression (compression level), that is required for the output to reach 90% of its final amplitude or compression level. The "release time" of the compressor is defined as the time after the complete removal of a signal that is required for the output to reach 63% of the final amplitude. It is desirable for the attack time to be as short as possible so that there is a minimum of distortion and lost information. Also, it is desirable for the release time to be relatively long so that the amplifier does not amplify undesirable noise during normal pauses in speech. However, the attack and release times have always been interdependent and in prior art structures it is necessary to reach a compromise which is satisfactory for both times. In the present amplifier the attack time has been substantially reduced while the release time is the same or longer than in prior art amplifiers.

Semiconductor means, which in this embodiment are a first pair of diodes 50 and 51 connected in series and the series combination connected in parallel with the resistor 36 and a second pair of diodes 52 and 53 connected in series and the series combination connected in parallel with the resistor 36 in the opposite orientation, are utilized to substantially decrease the R-C charge time of the capacitor 43 in the compressor circuit for signals in excess of the compression level. When the audio output signal from the operational amplifier 15 exceeds the predetermined constant level by a predetermined amount, which in this embodiment is two diode drops, the diodes 50–53 conduct and quickly reduce the R-C charge time of the capacitor 43 and, thereby, quickly reduce the output signal to the predetermined constant level. However, when the output signal is within the predetermined amount (two diode drops) the diodes 50–53 have substantially no effect on the circuit and the compressor circuitry between junction 20 and junction 12 operates in the normal manner. Two sets of diodes 50–51 and 52–53 are used to conduct either polarity of the AC signal around the resistor 36.

A gain control resistor 55 is connected from the junction 20 at the output of the operational amplifier 15 to the input terminal 2 thereof. The size of the gain control resistor 55 determines the amount of feedback supplied from the output to the input of the operational amplifier 15 and, therefore, determines the gain thereof. Semiconductor controlled circuitry is connected from the output to the input of the operational amplifier 15 in parallel with the resistor 55 as follows. A first string of four series connected diodes 60–63 has the anode of diode 63 connected to the junction 20 and the cathode of diode 60 connected through a resistor 64 to ground 40. A second string of four series connected diodes 65–68 has the cathode of diode 68 connected to the junction 20 and the anode of diode 65 connected through a resistor 69 to the positive voltage terminal 30. The anode of a first diode 75 is connected to the junction of the resistor 64 and the cathode of the diode 60 and the cathode of the diode 75 is connected to the anode of a second diode 76, the cathode of which is connected to the junction of the resistor 69 and the anode of the diode 65. The junction between the diodes 75 and 76 is connected through a resistor 77 to the input terminal 2 of the operational amplifier 15. When the output signal at the junction 20 exceeds four diode drops in either a maximum or a minimum direction the diodes 75 or 76 begin to conduct and connect a high resistance in parallel with the resistor 55 to lower the gain of the operational amplifier 15 somewhat. When the output signal at the junction 20 exceeds five diode drops, in either a maximum or minimum direction, the diodes 75 or 76 are in full conduction and the resistor 77 is connected in parallel with the resistor 55 which reduces the gain of the operational amplifier 15 to approximately one. Thus, extremely high signals applied at the input terminal 2 of the operational amplifier 15 are limited to a predetermined value in excess of the predetermined constant level. This limiting is substantially instantaneous and prevents overdriving the amplifier 15. Because of the limiting action the amplifier 15 does not operate in saturation in any normal mode and there is less tendency to square-off the peaks of output signals. This improves the quality of operation since square output signals produce distortion and the high harmonic content therein interferes with adjacent channels in radio-telephone systems. In the present embodiment the output signal is limited to approximately a five diode drop maximum deviation in either direction (approximately 3.5 volts) and the predetermined constant level is approximately a one volt deviation in either direction.

In the present embodiment a 24 volt supply is connected to the power terminal 30. All of the diodes 37, 38, 50–53, 75–76, 60–63 and 65–68 are silicon semiconductor diodes. The resistors and capacitors have the following values:

| | | |
|---|---|---|
| Resistor | 25 | 47K ohms |
| | 28 | 47K |
| | 11 | 47K Ohms |
| | 14 | 10K |
| | 29 | 2.7K |
| | 36 | 27K |
| | 42 | 390K |
| | 45 | 1K |
| | 55 | 1.5 Meg. |
| | 64 | 10K |
| | 69 | 18K |
| | 77 | 10K |
| Capacitor | 13 | .05 µf |
| | 21 | 1.0 |
| | 27 | 1.0 |
| | 32 | 10 Pf |
| | 33 | 15 µf |
| | 35 | 1.0 |
| | 43 | 4.7 |
| | 47 | .001 |

These values provide approximately 9 volts bias at the input terminal 3, which biases input terminal 2 at 9 volts and the audio output at terminal 6 to 9 volts. Thus, in this embodiment the semiconductor controlled circuitry begins to reduce the gain of the operational amplifier 15 when the signals reach a maximum amplitude of approximately 11.4 volts and a minimum amplitude of 6.6 volts. While specific values of voltages and components are described it should be understood that these are only exemplary and any values may be utilized which will provide the desired results. Also, the specific number of diodes utilized in the various circuits may be changed to provide different predetermined values.

Thus, because the output signal at the junction 20 is limited to a maximum deviation of approximately 3.5 volts in either polarity, the gate 22 is protected from receiving too large a signal and leaking through the field effect transistor. Further, because the deviation of the audio signal at the junction 20 never exceeds the predetermined amount, approximately 3.5 volts, the compressor circuitry requires a much shorter time to return the signal to the predetermined constant level. Also, because the amplifier 15 operates linearly substantially all the time the output peaks are not squared and the high harmonic content of the square waves is eliminated. Thus, distortion and interference are substantially reduced.

Referring to FIG. 2, a typical output waveform from a prior art audio compressor amplifier is illustrated. From this waveform it can be seen that the initial unlimited output signal has an excessive deviation in both polarities with the peaks of the signals squared by overdriving of the amplifier, which signal will leak through any field effect transistor gates to which it is applied. Also, because of the excessive deviation the compressor circuitry tends to overshoot and reduce the output of the operational amplifier to nearly zero, after which a substantial period of time is required for the output to build up to the desired output level. During the overshoot the audio is lost and, as can be seen in FIG. 2, a DC shift is produced which can cause an annoying "pop" in a speaker. Typically, for an input that is 20 DB higher than required to produce the desired output (20 DB above the compression level), the attack time, or the time elapsed between the beginning of the excessive output wave and the return to the desired output level, requires as much as 100 milliseconds.

Referring to FIG. 3, three different waveforms A, B and C are illustrated wherein 10, 20 and 40 DB signals above the compression level, respectively, were applied to the input terminal 10 of the circuitry in FIG. 1. It can be seen from FIG. 3 that the output signals were all limited to a maximum deviation of approximately 3.5 volts and, because of the diodes 50–53 in the compressor circuitry, the attack time is decreased to a near optimum. In waveform A of FIG. 3, for example, the attack time is approximately 5 milliseconds. Similarly in waveform B of FIG. 3, where 20 DB of signal above compression level is applied to the input terminal 10, the attack time is only 20 milliseconds as compared to the 100 milliseconds required in the prior art circuitry illustrated by the waveform in FIG. 2. Further, the DC shift has been eliminated so that there is substantially no loss of audio and no pops in the speaker. Signals at twice the final compression level are in a linear range (low distortion) of the amplifier and are usable even though they are higher than the compression level. Therefore, the practical attack time of the present amplifier is actually reduced to less than half the value shown. Thus, it can be seen that the present circuitry is a substantial improvement in audio compressor amplifiers since the output is limited to protect field effect transistor gates attached thereto and the attack time is substantially decreased to reduce the amount of information lost and distortion caused by overdriving.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:
1. An audio compressor amplifier comprising:
   a. an audio amplifier circuit having an output and an input;
   b. compressor means connected from the output to the input of said amplifier circuit for controlling the input of said amplifier circuit to compress signals at the output to a predetermined constant level in a predetermined attack time;
   c. semiconductor means connected in said compressor means for decreasing the attack time when the output signal exceeds the predetermined constant level by a predetermined amount;
   d. gain control feedback means connected from the output to the input of said amplifier circuit for controlling the gain thereof; and
   e. semiconductor controlled circuitry connected to the output of said amplifier circuit and said gain control feedback means for controlling said gain control feedback means to reduce the gain of said amplifier circuit when a signal at the output exceeds a predetermined value in excess of the predetermined constant level.

2. An audio compressor amplifier as claimed in claim 1 wherein the audio amplifier circuit includes an operational amplifier.

3. An audio compressor amplifier as claimed in claim 2 wherein the gain control feedback means includes a first resistor.

4. An audio compressor amplifier as claimed in claim 3 wherein the semiconductor controlled circuitry includes a second resistor and a pair of diodes connected to be normally reverse biased and to be forward biased by a signal a predetermined value in excess of the predetermined constant level at the amplifier output, said diodes connecting said second resistor in parallel with said first resistor in the forward biased condition.

5. An audio compressor amplifier as claimed in claim 1 wherein the compressor means includes rectifying and filtering circuitry for converting an AC signal at the output of the amplifier circuit to a DC control signal and a transistor connected to the input of the amplifier circuit and controlled by the DC control signal for varying the amount of signal applied to the input of the amplifier circuit.

6. An audio compressor amplifier as claimed in claim 5 wherein the rectifying and filtering circuitry has a resistance in series therewith for providing a predetermined attack time in the compressor means and the semiconductor means includes a plurality of diodes connected in parallel with said resistance for bypassing said resistance with signals larger than a predetermined value in excess of the predetermined constant level.

7. An audio compressor amplifier as claimed in claim 6 wherein the plurality of diodes includes at least two diodes connected in series and the series circuit connected in parallel with the resistance in a first direction and at least two more diodes connected in series and the series circuit connected in parallel with the resistance in a second direction for bypassing signals of either polarity.

8. An audio compressor amplifier comprising:
  a. an operational amplifier having an output and an input;
  b. rectifying and filtering circuitry for converting an AC signal at the output of said operational amplifier to a DC control signal and a transistor connected to the input of said operational amplifier and controlled by the DC control signal for varying the amount of signal applied to the input of said operational amplifier to compress signals at the output to a predetermined constant level;
  c. first resistance means in series with said rectifying and filtering circuitry for providing a predetermined attack time and a plurality of diodes connected in parallel with said first resistance means for bypassing said first resistance means with signals larger than a predetermined value in excess of the predetermined constant level;
  d. second resistance means connected from the output to the input of said operational amplifier for controlling the gain thereof; and
  e. semiconductor controlled circuitry including third resistance means connected to the output of said operational amplifier and to said second resistance means for connecting the third resistance means in parallel with said second resistance means to reduce the gain of said operational amplifier when a signal at the output exceeds a predetermined value in excess of the predetermined constant level.

* * * * *